United States Patent [19]

Berg

[11] 3,873,319

[45] Mar. 25, 1975

[54] DRY-FILM NEGATIVE PHOTORESIST HAVING AMIDIZED STYRENE-MALEIC ANHYDRIDE BINDER MATERIAL

[75] Inventor: Carl John Berg, St. Paul, Minn.

[73] Assignee: Minnesota Mining and Manufacturing Company, St. Paul, Minn.

[22] Filed: Jan. 31, 1974

[21] Appl. No.: 438,206

[52] U.S. Cl. .................... 96/87 R, 96/35.1, 96/36.2, 96/86 P, 96/115 P

[51] Int. Cl. .................... G03c 1/70

[58] Field of Search ................ 96/115 P, 87 R, 86 P

[56] References Cited

UNITED STATES PATENTS

| | | | |
|---|---|---|---|
| 3,070,158 | 12/1962 | Roper et al. | 166/9 |
| 3,476,086 | 11/1969 | Verdol et al. | 252/51.5 |
| 3,753,715 | 8/1973 | Klupfel et al. | 96/86 P |
| 3,765,898 | 10/1973 | Bauer et al. | 96/115 P |

*Primary Examiner*—Ronald H. Smith
*Attorney, Agent, or Firm*—Alexander, Sell, Steldt & De La Hunt

[57] ABSTRACT

Photopolymerizable composition comprising photopolymerizable monomers dispersed in a binder material that is the reaction product of a styrene-maleic anhydride and a dialkylamine. Such a photopolymerizable composition can be used as a heat-adhereable photosensitive layer carried on a carrier film to form a dry-film, negative-acting photoresist.

6 Claims, No Drawings

DRY-FILM NEGATIVE PHOTORESIST HAVING AMIDIZED STYRENE-MALEIC ANHYDRIDE BINDER MATERIAL

BACKGROUND OF THE INVENTION

A complex set of properties is required of the film-forming polymeric binder material in which photopolymerizable monomers are dispersed to form the photosensitive layer of a typical dry-film photoresist. For example, the binder material is a key to providing the photosensitive layer with a difficult balance of initial adhesion to, and later two-stage removability from, a metal substrate that is to be protected by the photoresist. The needed adhesion and removability properties can be summarized as follows:

1. The whole photosensitive layer must develop good initial adhesion to the metal substrate, generally by passage of the photoresist and metal substrate through heated pressure rollers. In order to develop useful adhesion to the metal substrate, some prior art photoresist films have required expensive and time-consuming priming operations of the metal substrate and delays after lamination before subsequent process steps.

2. After imagewise light-exposure, the photosensitive layer must exhibit an imagewise differential removability from the metal substrate in a "developing" bath. Removal should be rapid and easy so that the developing time is short; the definition and resolution of the image or "resist" area left on the metal substrate should be sharp; and the surface of the metal substrate uncovered in the developing bath should be clean.

3. The unremoved image or resist area of the developed photosensitive layer must fully protect the metal substrate covered by the image area during subsequent etching or plating operations. A major deficiency of some prior art dry-film-photoresists is a failure to provide such protection, particularly during use of copper pyrophosphate plating baths.

4. The image or resist areas of the photosensitive layer must be readily removable once processing of the uncovered areas of the metal substrate is completed. Some prior art photoresists have required several minutes of scrubbing the processed laminate to remove the resist areas of a photosensitive layer.

Another factor that bears on the properties needed by the binder material is a desire, for reasons of ecology and improved working conditions, that the photosensitive layer be developable in an aqueous bath. Most commercial dry-film photoresists are developed in baths based on organic solvents, but there have been attempts at photoresists developed in aqueous baths, as summarized in South Africa Pat. No. 720,345. However, to my knowledge, the prior suggestions have not led to commercial aqueous-developable dry-film photoresists that are fully satisfactory, especially for use in copper pyrophosphate baths. For example, I have worked with copolymers of styrene and maleic anhydride, which are taught in the South African patent cited above, but have found that the image areas of photosensitive layers that use such a binder material tend to lift off the metal substrate in a copper pyrophosphate plating bath, whereupon plating occurs in areas that were to have been protected by the resist.

In summary, if satisfactory aqueous development of dry-film negative-acting photoresists is to be provided, new binder materials for the photosensitive layer, providing the balance of adhesion and removal properties listed above in aqueous processing baths, will be needed.

SUMMARY OF THE INVENTION

Briefly, a dry-film negative photoresist of the invention comprises (1) a carrier film; (2) a photosensitive layer carried on the carrier film that is heat-softenable and adhereable to a metal substrate, reacts when exposed to an imagewise pattern of light to provide imagewise differential removability from the metal substrate in an aqueous developing bath, and comprises (a) 100 parts by weight of a binder material that includes the reaction product of a styrene-maleic anhydride copolymer and dialkylamine in which the alkyl group has about 4 to 8 carbon atoms, the styrene-maleic anhydride copolymer has a molecular weight of about 1,000 to 10,000, and between about one-third and two-thirds of the anhydride groups are reacted with the dialkylamine, (b) about 50 to 200 parts by weight of photopolymerizable monomer dispersed in the binder material, and (c) a catalytic amount of a photoinitiator that initiates reaction of the photopolymerizable monomer upon imagewise exposure of the photosensitive layer to light; and (3) a protective cover film disposed over the photosensitive layer.

ADDITIONAL PRIOR ART

There have been many prior suggestions for reacting styrene-maleic anhydride copolymers with amines. For example, in U.S. Pat. No. 3,070,158 an adduct of an amine such as dimethylamine and styrene-maleic anhydride copolymer is taught for use as a water-thickener. In U.S. Pat. No. 3,476,686 adducts of amines and styrene-maleic anhydride copolymers are taught for use as additives in lubricating oils.

Insofar as known, however, none of the prior suggestions concerning reaction of amines and styrene-maleic anhydride copolymers has suggested use of an amidized styrene-maleic anhydride copolymer as a binder material for a photopolymerizable composition, and none of them have suggested that such a binder material would satisfy a need for a binder material in aa dry-film photoresist that is to be developed in an aqueous bath.

DETAILED DESCRIPTION

Styrene-maleic anhydride copolymers are commercially available materials, and those useful in this invention generally include styrene and maleic anhydride monomers in a one-to-one ratio. The molecular weight of the styrene-maleic anhydride copolymer used in the invention should be low so that the copolymer will be rapidly removable in a developing bath. Generally the molecular weight of the styrene-maleic anhydride copolymer is less than 10,000 and preferably is less than 5,000. On the other hand, the molecular weight should be high enough to provide good integrity to the photosensitive layer. Generally the molecular weight of the styrene-maleic anhydride copolymer is at least 1,000 and preferably at least 1,500.

The dialky secondary amine that is reacted with the styrene-maleic anhydride copolymer can be straight-chain or branched. Generally, useful results are obtained with dialkylamines in which the alkyl has between about 4 and 8 carbon atoms. If the alkyl group has less 4 carbon atoms, the photopolymerizable composition exhibits poorer adhesion to a metal substrate and does not resist some common plating baths, while, if the alkyl group has more than about 8 carbon atoms, the photopolymerizable composition is too soft to give a good film.

The dialkyl secondary amine is reacted with the styrene-maleic anhydride copolymer by conventional known methods, generally involving simply mixing the two ingredients together in solution without use of catalysts. The reaction, which proceeds rapidly and completely, leaves a carboxyl group and an amide group instead of the anhydride group. Generally, sufficient amine is added so that between about one- and two-thirds of the anhydride groups are reacted with amine. Greater reaction of anhydride groups would introduce an excessive number of carboxyl groups, which appear to inhibit good adhesion of the photosensitive layer to the metal substrate during the heat-laminating step; while amidization of less than one-third of the anhydride groups appears to reduce adhesion of the image areas to the metal substrate in the plating baths.

The photopolymerizable monomers that are included in a photosensitive layer of the invention can vary widely. (The term "photopolymerizable monomer," as used herein, includes both low-molecular-weight compounds having no repeating groups and higher-molecular-weight prepolymers formed by reacting more elementary units together.) Preferred photopolymerizable monomers are chemically mixed acrylic-methacrylic acid esters of tris-(2-hydroxyethyl)-isocyanurate ("chemically mixed" means that acrylate and methacrylate groups can coexist on the same molecule), as taught in an application of Berg et al., Ser. No. 438,207, filed on the same day as this application. Preferably, the tris-(2-hydroxyethyl)-isocyanurate is reacted with a mixture containing acrylic acid and methacrylic acid in a 60:40 ratio, but the ratio of acrylic to methacrylic acid can vary widely from that preferred ratio. These chemically mixed esters have been found to resist crystallization under normal storage conditions, and thus provide photopolymerizable compositions of long storage life.

Other useful photopolymerizable monomers that can be included in photoresist films of the invention include compounds such as described in Plambeck U.S. Pat. No. 2,760,863 and Schoenthaler U.S. Pat. No. 3,418,295, and prepolymers such as described in Crary U.S. Pat. No. 3,661,576. The descriptions of photopolymerizable monomers in those patents are incorporated herein by reference. Generally, the photopolymerizable monomers described in those patents have ethylenic unsaturation, generally at terminal locations. They average at least one, preferably two to four, terminal groups having ethylenic unsaturation, and they form large polymer molecules by addition-polymerization, which is typically initiated when free radicals are formed by subjecting certain photoinitiating compounds to actinic radiation. Often the terminal ethylenic unsaturation is conjugated with a doubly bonded carbon, including carbon doubly bonded to such heteroatoms as nitrogen, oxygen and sulfur. Esters formed from polyols and acrylic and methacrylic acids are particularly useful.

The photoinitiator that is generally included in photopolymerizable compositions of the invention can be any compound that will react upon exposure to actinic radiation to initiate polymerization of the photopolymerizable monomer. Generally, as indicated above, the photoinitiator generates free radicals that cause addition-polymerization of photopolymerizable monomer through reaction of terminal ethylenically unsaturated groups at each end of the photopolymerizable monomer molecules. The photoinitiator should be thermally inactive at the elevated temperatures to which the photosensitive layer and photoresist may be subjected during drying and heat-lamination steps; generally thermal stability in the range of about 250°–350°F. is satisfactory. Catalytic amounts of the photoinitiator are used, generally on the order of about 0.1 to 20 weight-percent, preferably 1 to 5 weight-percent, of the photopolymerizable monomer. A wide variety of photoinitiators are useful in photoresists of the invention, including substituted or unsubstituted anthraquinones and phenanthraquinones; vicinal ketaldonyl compounds, such as diacetyl or benzil; alpha ketaldonyl alcohols such as benzoin; and benzophenones.

A preferred class of initiators is the class of vinyl-substituted halomethyl-s-triazines, such as 2-(4-methoxystyryl)-4,6-bis(trichloromethyl)-s-triazine, taught in a pending application, Ser. No. 177,851, filed Sep. 3, 1971. These photoinitiators are preferred because they induce higher cross-linking rates for the photopolymerizable monomers than do other photoinitiators; low concentrations of these photoinitiators can be used because of their effectiveness; they are less oxygen-inhibited than other photoinitiators; and they do not require the presence of sensitizing dyes.

A photosensitive layer in a photoresist of the invention will generally include other ingredients in addition to the photopolymerizable monomer, binder material and photoinitiator. Typically the photosensitive layer includes an indicating dye that changes color upon exposure to light so as to indicate areas that have been exposed. A typical useful indicating dye is 1′,3′,3′-trimethyl-6-nitrospiro(2,8)-1-benzopyrane-2,2′-indoline. In addition, the photosensitive layer may include adhesion promoters, coloring dyes, surfactants, thermal-polymerization inhibitors and other additives. All the ingredients, and especially the photopolymerizable monomer and binder material, are sufficiently compatible with one another so as to provide a film that readily transmits light.

The photopolymerizable compositions of the invention can be coated, generally from solution, onto a generally transparent carrier film by conventional techniques to form photosensitive layers, which are usually between about 0.5 and 2.0 mils thick, but for special purposes may be of different thickness, such as between 0.1 and 10 mils thick, and which are removable from the carrier film even after light-exposure. The photosensitive layer is generally covered with a protective cover film, which is also readily removable from the photosensitive layer. Photopolymerizable compositions of the invention can also be coated directly onto a metal substrate if that is desired.

Dry-film photoresists of the invention are useful with a wide variety of aqueous developing baths. One typical aqueous developing bath incorporates a small amount, such as one precent, of a moderate alkali such as sodium carbonate or sodium phosphate. After etching, plating or other processing of the metal substrate, the image areas of the photoresist layer can be removed by another aqueous bath which generally includes a stronger base such as a one-percent heated solution of sodium hydroxide or potassium hydroxide.

The invention will be further illustrated by the following examples.

Example 1

The photopolymerizable monomer in this example was a chemically mixed 60:40 acrylic acid/methacrylic acid ester of tris-(2-hydroxyethyl)-isocyanurate. This monomer was prepared by charging into a ten-gallon, glass-lined kettle equipped with a Barrett trap for collecting and measuring water of reaction, the following ingredients:

| | Grams |
|---|---|
| Acrylic acid | 3564 (49.5 moles) |
| Methacrylic acid | 2838 (33 moles) |
| Tris-(2-hydroxyethyl)-isocyanurate ("THEIC" polyol from Allied Chemical Company) | 6525 (25 moles) |
| P-toluenesulfonic acid | 545 |
| Phenothiazine | 1.3 |

The batch was heated with stirring to 175°F. to insure solution, after which 3,340 grams of benzene was added as an azeotrope to remove water of reaction. The temperature was increased to 190°–200°F., and in 2 hours 10 minutes, 1220 grams or 90 percent of the theoretical water had been collected. At this point the kettle was cooled rapidly. When the batch was below 75°F., 7.6 liters each of benzene and heptane were added. The batch was then washed several times with alkaline solutions and deionized water. The organic phase was placed over molecular sieves after these washings, stored overnight in a cooler, and then filtered off into a 20-gallon glass kettle. One gram of phenothiazene was added, and benzene removed by applying a vacuum of 20 inches and heated at 125°F. for 1 hour. The product was then drained into an epoxy-lined pail. There was obtained 18.6 pounds of product (76 percent of the amount theoretically obtainable from the ingredients).

Next, a 5-gallon, epoxy-lined pail, equipped with an air-motor-driven mechanical stirrer, was charged with 4600 grams of methyl ethyl ketone. A sheet of clear polytetrafluoroethylene (Teflon) having one hole for the stirrer shaft and another one-inch diameter hole for a plastic funnel, was placed over the top of the pail. Next 3310 grams of styrene-maleic anhydride copolymer having a molecular weight of about 1600 (SMA-1000 A resin from Arco) was introduced into the pail through the funnel over a period of several minutes with stirring. The copolymer dissolved completely in the solvent in 45 minutes at 30°C. Next 1210 grams of di-n-hexylamine was added smoothly through the funnel over a period of one minute, during which time there was an exotherm from 30°C. to 47°C. The solution was left to cool to room temperature, and then 1608 grams of a 2 weight-percent-solids solution of 1,5-bis (4-dimethylaminophenyl)pentadienone-3 indicating dye in tetrafuran was added with stirring.

Next 5025 grams of the photopolymerizable monomer described above, which included 10.4 percent of benzene solvent, was rapidly mixed into the solution. Then 904 grams of a 10 percent-solids solution of benzotriazole in tetrahydrofuran; 36 grams of a fluorocarbon surfactant; 246 grams of a 15 weight-percent-solids solution of 2-(4-methoxystyryl)-4,6-bis(trichloromethyl)-s-triazine in tetrahydrofuran; and 565 grams of a 8.0 percent-solids dispersion of duPont's Monastrol Blue BT 417D nonflocculating blue pigment in methyl isobutyl ketone were added to the solution.

The complete mixture was then coated onto a 2-mil thick polyethylene terephthalate film by an extrusion knife, and dried at 70°C. for 7 minutes to produce a 1.7-mil thick dry photosensitve layer. Thereupon the coated film was wound into a roll, together with a 2-mil thick liner or cover film of polyethylene.

The photoresist was then tested by first removing the cover film and laminating the photoresist, photosensitive layer down, to a copper-clad substrate by passing the photoresist and substrate through pressure rolls that were heated to over 130°F. and applied 15–30 pounds per square inch pressure. The photosensitive layer was then exposed (through the polyethylene terephthalate film) through a high-contrast photographic transparency of a printed circuit pattern including a series of 5-mil wide lines separated by 5-mil wide spaces by low-pressure ultraviolet mercury lamps ("Colight" Model M-218 exposure frame using GE H400A-33-1/T 16 400-watt mercury vapor lamp bulbs) for 90–180 seconds. Next the polyethylene terephthalate carrier film was removed and a one percent-solids solution of sodium carbonate in water was sprayed onto the laminate through a commercial spray developer for one minute, which removed the nonexposed areas of the photosensitive layer. The result was well-defined tough adherent dimensionally true image or resist areas.

Next, the laminate was immersed for 36 minutes in a potassium copper pyrophosphate solution heated to 50°C. The laminate was then rinsed and dried by rubbing with a paper towel. There was no apparent change in the resist areas.

The resist areas were then removed by spraying the laminate with a one percent-solids solution of sodium hydroxide in water heated to 150°F. for 1–2 minutes.

These tests were repeated on samples of the photoresist of this example at several month intervals through a period of 8 months with similar results. Resist patterns prepared as described above were also successfully subjected to etching operations using ferric chloride, acidic ammonium persulfate, and even strong hydrochloric acid solutions.

Example 2

Dibutylamine in an amount of 1.29 parts was added to a solution containing 4.04 parts of the styrene-maleic anhydride copolymer described in Example 1 and 4.04 parts of methyl ethyl ketone, whereupon the ingredients immediately reacted to form a product having a ratio of anhydride groups to amide groups of 1 to 1. A coating solution was then prepared under yellow light by adding 5.33 parts of the photopolymerizable monomer and 0.50 part of a 15-percent solution in tetrahydrofuran of the photoinitiator described in EXample 1. The solution was then coated onto two-mil thick polyethyleneterephthalate film and dried in the manner described in Example 1. The resulting photosensitive layer was laminated to a copper substrate, exposed to an imagewise pattern of light, and developed and tested in the manner described in Example 1. The photosensitive layer had low adhesion to both the cover film and the carrier film, and had good adhesion to the metal copper substrate throughout these operations, and it had adequate resistance to immersion in a heated copper pyrophosphate bath.

Example 3

A solution containing 1.89 parts of di(2-ethylhexyl) amine and 4.24 parts of methyl ethyl ketone was added with shaking to a solution containing 3.89 parts of the styrene-maleic anhydride copolymer of Example 1 and 3.85 parts of methyl ethyl ketone. Reaction required about 2 minutes, after which 5.52 parts of the photopolymerizable monomer described in Example 1 was added and the mixture shaken well. Next, under a yellow light, 2.2 parts of the solution of indicating dye, 0.9 part of the solution of photoinitiator, 1.1 parts of the solution of benzotriazole, 0.04 part of a fluorocarbon surfactant, and 0.55 part of the pigment suspension described in Example 1 were added. The solution was mixed well and coated onto two-mil thick polyethyleneterephthalate film and dried as in Example 1. The photosensitive layer was then laminated to a clean copper substrate, exposed to an imagewise pattern of light, and developed as in Example 1. The imaged area remained intact after immersion in a warm copper pyrophosphate bath for 36 minutes. The copper surface in the non-imaged area was free of residue and was instantly etchable after development in a ferric chloride solution.

Example 4

This example shows the use as photopolymerizable monomer in a photopolymerizable composition of the invention of an "epoxy acrylate," namely, the reaction product of methacrylic acid and diglycidyl ether of bisphenol A ("Epocryl" U-12, from Shell Chemical Company, having a molecular weight of about 460). This epoxy acrylate in the amount of 2.76 parts dissolved in 2.76 parts of methyl ethyl ketone was added to 6.9 parts of a solution containing 2.76 parts of the amidized styrene-maleic anhydride copolymer of Example 1 dissolved in methyl ethyl ketone. Next, under yellow light illumination, 1.10 parts of the indicating dye solution, 0.15 part of the photoinitiator solution, 0.022 part of the fluorocarbon surfactant, 0.057 part of the benzotriazole solution, and 0.289 part of the pigment suspension described in Example 1 were added. The above mixture was shaken well and knife-coated onto optically clear 2-mil thick polyethylene terephthalate film, after which the coated film was dried at 70°C. for 7 minutes. The coating was then cooled and covered with 2-mil clear polyethylene.

To test the resulting dry-film photoresist, the polyethylene liner was removed and the photosensitive layer laminated to a copper substrate, exposed to an imagewise pattern of light, and developed in the manner described in Example 1. The uncovered copper areas after development were clean and instantly etchable in ferric chloride spray. The image areas of the photosensitive layer showed good resolution with 2-mil wide lines and 3-mil wide spaces, and these areas withstood a copper pyrophosphate bath heated to 50°C. for 36 minutes, remaining firm and protective.

Example 5

This example shows the use with binder material of the invention of another commercial photopolymerizable monomer, namely, the reaction product of acrylic acid and pentaerythritol ("Sartomer" Brand 295 monomer, in which an average of 3.3 hydroxyl groups on each molecule of pentaerythritol is reacted with acrylic acid). This monomer in an amount of 5.71 parts was added to a solution of the binder material of Example 1, which had been prepared by adding 4.04 parts of styrene-maleic anhydride copolymer in 4.04 parts of methyl ethyl ketone into 1.48 parts of dihexylamine contained in 2.50 parts of methyl ethyl ketone. After 1.14 parts of the benzotriazole solution, 0.3 part of the solution of photoinitiator, and 2.21 parts of the indicating dye solution of Example 1 were added to the solution under yellow light, the ingredients were mixed and then coated and dried on a 2-mil thick polyethylene terephthalate film. Upon lamination to a clean copper substrate, imagewise exposure, development, and rinsing as in Example 1, well-defined image areas were obtained and the uncovered copper surface was clean and instantly etchable. The imaged areas were stable in a warm copper pyrophosphate bath.

What is claimed is:

1. A dry-film negative photoresist comprising (1) a carrier film; (2) a photosensitive layer carried on the carrier film that is heat-softenable and adhereable to a metal substrate, reacts when exposed to an imagewise pattern of light to provide imagewise differential removability from the metal substrate in an aqueous developing bath, and comprises (a) 100 parts by weight of the reaction product of a styrene-maleic anhydride copolymer and dialkylamine in which the alkyl group has 4 to 8 carbon atoms, the styrene-maleic anhydride copolymer has a molecular weight of about 1,000 to 10,000, and between about one-third and two-thirds of the anhydride groups are reacted with the dialkylamine, (b) about 50 to 200 parts by weight of compatible photopolymerizable monomer dispersed in the binder material, and (c) a catalytic amount of a photoinitiator for initiating imagewise reaction of the photopolymerizable monomer upon imagewise exposure of the photosensitive layer to light; and (3) a protective cover film disposed over the photosensitive layer.

2. A photoresist of claim 1 in which the photopolymerizable monomer comprises a chemically mixed acrylic acid/methyacrylic acid ester of tris-(2-hydroxyethyl)isocyanurate.

3. A photoresist of claim 1 in which the dialkylamine is di-n-hexylamine.

4. A photopolymerizable composition useful as a negative photoresist, and that in film form is heat-softenable and adhereable to a copper substrate, and reacts when exposed to an imagewise pattern of light to provide imagewise differential removability from the copper substrate in an aqueous developing bath, comprising (a) 100 parts by weight of the reaction product of a styrene-maleic anhydride copolymer and dialkylamine in which the alkyl group has 4 to 8 carbon atoms, the styrene-maleic anhydride copolymer has a molecular weight of about 1,000 to 10,000, and between about one-third and two-thirds of the anhydride groups are reacted with the dialkylamine; (b) about 50 to 200 parts by weight of a compatible photopolymerizable monomer dispersed in the binder material, said monomer having on the average between about 2 and 4 terminal ethylenically unsaturated groups by which the photopolymerizable monomer undergoes chain-propagating addition polymerization in the presence of actinic radiation; and (c) a catalytic amount of a photoinitiator that initiates and promotes imagewise reaction of the photopolymerizable monomer upon imagewise exposure of the photopolymerizable composition to light.

5. A photopolymerizable composition of claim 4 in which the photopolymerizable monomer comprises a chemically mixed acrylic acid/methacrylic acid ester of tris-(2-hydroxyethyl)isocyanurate.

6. A photopolymerizable composition of claim 4 in which the dialkylamine is di-n-hexylamine.

* * * * *